United States Patent
Su et al.

(10) Patent No.: US 11,043,596 B2
(45) Date of Patent: Jun. 22, 2021

(54) SEMICONDUCTOR DEVICE AND FABRICATION METHOD THEREOF

(71) Applicant: UNITED MICROELECTRONICS CORP., Hsin-Chu (TW)

(72) Inventors: Shih-Wei Su, Tainan (TW); Hao-Hsuan Chang, Kaohsiung (TW); Chih-Wei Chang, Tainan (TW); Chi-Hsuan Cheng, Kaohsiung (TW); Ting-An Chien, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/451,018

(22) Filed: Jun. 25, 2019

(65) Prior Publication Data

US 2020/0411681 A1    Dec. 31, 2020

(51) Int. Cl.
| | |
|---|---|
| H01L 21/762 | (2006.01) |
| H01L 29/66 | (2006.01) |
| H01L 29/78 | (2006.01) |
| H01L 21/768 | (2006.01) |

(52) U.S. Cl.
CPC .......... *H01L 29/785* (2013.01); *H01L 21/762* (2013.01); *H01L 21/76852* (2013.01); *H01L 21/76877* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 10,079,143 B2 | 9/2018 | Ting | |
| 2008/0182381 A1* | 7/2008 | Kiyotoshi | H01L 21/76229 438/427 |
| 2011/0097889 A1* | 4/2011 | Yuan | H01L 21/845 438/595 |
| 2015/0140819 A1 | 5/2015 | Huang | |
| 2017/0330742 A1* | 11/2017 | Ting | H01L 21/823481 |

\* cited by examiner

*Primary Examiner* — Telly D Green
(74) *Attorney, Agent, or Firm* — Winston Hsu

(57) ABSTRACT

A method for forming a semiconductor device is disclosed. A substrate having at least two fins thereon and an isolation trench between the at least two fins is provided. A liner layer is then deposited on the substrate. The liner layer conformally covers the two fins and interior surface of the isolation trench. A stress-buffer film is then deposited on the liner layer. The stress-buffer film completely fills a lower portion that is located at least below half of a trench depth of the isolation trench. A trench-fill oxide layer is then deposited to completely fill an upper portion of the isolation trench.

9 Claims, 2 Drawing Sheets

SEMICONDUCTOR DEVICE AND FABRICATION METHOD THEREOF

BACKGROUND OF THE INVENTION

1. Field of the Invention

The present invention relates to the field of semiconductor process technology, and more particularly to a method for forming semiconductor fin structures with improved fin height profile control.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, nonplanar FETs, such as the fin field effect transistor (finFET) have three-dimensional structure, not only capable of increasing the contact to the gate but also improving the controlling of the channel region, such that the nonplanar FETs have replaced the planar FETs and become the mainstream of the development.

The current method of forming the finFETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the finFETs also faces more challenges and limitations. Hence, the semiconductor device and method of forming the same does still not fully meet the demand of the product, and requires further improvement.

SUMMARY OF THE INVENTION

The invention provides an improved semiconductor device and a manufacturing method thereof, which can improve fin height profile control and device performance.

One aspect of the invention provides a method for forming a semiconductor device is disclosed. A substrate having at least two fins thereon and an isolation trench between the at least two fins is provided. A liner layer is then deposited on the substrate. The liner layer conformally covers the two fins and interior surface of the isolation trench. A stress-buffer film is then deposited on the liner layer. The stress-buffer film completely fills a lower portion that is located at least below half of a trench depth of the isolation trench. A trench-fill oxide layer is then deposited to completely fill an upper portion of the isolation trench.

According to some embodiment, the liner layer is a silicon oxide layer deposited by performing an atomic layer deposition (ALD) process.

According to some embodiment, the stress-buffer film comprises amorphous silicon.

According to some embodiment, the stress-buffer film has a thickness that is greater than or equal to about 40 angstroms at a fin pitch of about 48 nm.

According to some embodiment, the stress-buffer film has a thickness ranging between about 40 angstroms and about 80 angstroms at a fin pitch of about 48 nm.

According to some embodiment, the trench-fill oxide layer is a silicon oxide layer deposited by performing a flowable chemical vapor deposition (FCVD) process.

According to some embodiment, the method further comprises: subjecting the trench-fill oxide layer to an anneal process.

According to some embodiment, during the anneal process, the stress-buffer film is converted to silicon suboxide film of formula SiOy, wherein y<2.

According to some embodiment, the method further comprises: polishing the trench-fill oxide layer, the stress-buffer film, and the liner layer until a top surface of the at least two fins is exposed; and recess etching the trench-fill oxide layer, the stress-buffer film, and the liner layer, thereby exposing an upper portion of the each of the at least two fins.

Another aspect of the invention provides a semiconductor device including a substrate having at least two fins thereon and an isolation trench between the at least two fins; and an isolation structure in the isolation trench. The isolation structure consists of a liner layer covering a lower sidewall of each of the at least two fins and a bottom surface of the isolation trench, and a stress-buffer film on the liner layer. The stress-buffer film is a silicon suboxide film of formula SiOy, wherein y<2.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
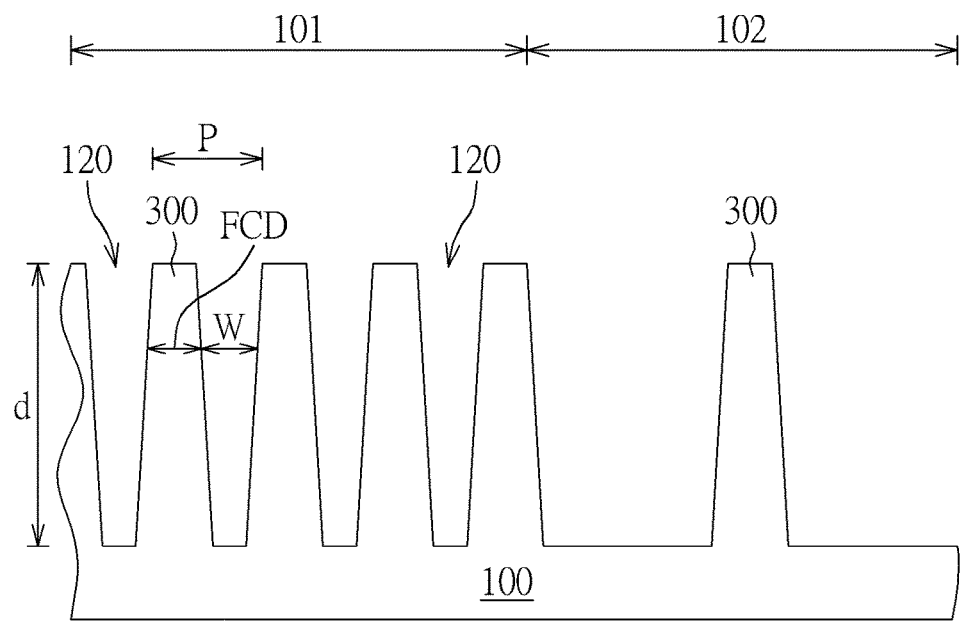
FIGS. 1-4 are schematic diagrams illustrating a method of forming a semiconductor device according to one embodiment of the present invention.

FIGS. 1-4 are schematic diagrams illustrating a method of forming a semiconductor device according to one embodiment of the present invention. As shown in FIG. 1, a substrate 100 having multiple fins 300 thereon is provided. The multiple fins 300 are separated from one another by isolation trenches 120 having a trench depth d. For example, the substrate 100 may include a semiconductor substrate such as a silicon containing substrate or a silicon-on-insulator (SOI) substrate. The substrate 100 may include a dense region 101 and an isolated region 102. The fins 300 may be disposed in the dense region 101 and the isolated region 102 of the substrate 100 but in different pitches, as shown in FIG. 1. The pitch of the fins 300 in the dense region 101 is smaller than the pitch of the fins 300 in the isolated region 102. According to one embodiment, the fins 300 in the dense region 101 may have a fin pitch P of about 48 nm, which is the combination of the fin critical dimension (FCD) and the trench width W. For example, the fin critical dimension (FCD) may be 13 nm and the trench width W may be 35 nm, but is not limited thereto.

According to one embodiment, the fins 300 may be formed through a self-aligned double patterning (SADP) process, such as sidewall image transfer (SIT) process. For example, the formation of the fins 300 includes forming a plurality of mandrels (not shown in the drawings) on the substrate 100 by using a photolithography and an etching process, performing a depositing and an etching processes sequentially to form a plurality of spacers (not shown in the drawings) at sidewalls of the mandrels, using the spacers as a mask to form a patterned hard mask underneath, and then, forming a plurality of isolation trenches 120 in the substrate 100 to define the fins 300. However, in another embodiment, the formation of the fins 300 may also be accomplished by first forming a patterned hard mask (not shown in the drawings) on the substrate 100, and then performing an epitaxial process on the exposed substrate 100 through the patterned hard mask to form a semiconductor layer (not shown in the drawings) such as silicon or silicon germanium layer to configure as corresponding fin shaped structures. A fin cut process (not shown in the drawings) may be performed to remove unwanted portions of the fins.

Figure 2:
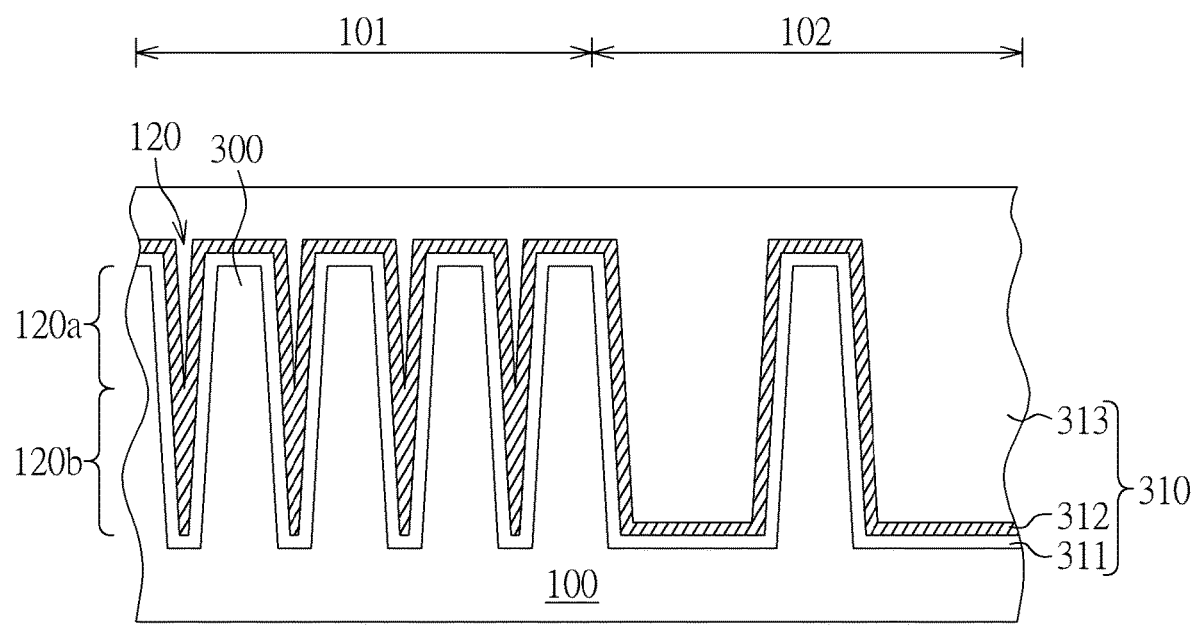

As shown in FIG. 2, the isolation trenches 120 between the fins 300 are filled with an isolation layer 310. According to one embodiment, the isolation layer 310 includes a liner layer 311, a stress-buffer layer 312 on the liner layer 311, and a trench-fill oxide layer 313 on the stress-buffer film 312. According to one embodiment, the liner layer 311 is formed right after the fins 300 are formed, by depositing an oxide layer on the substrate 100 in a blanket manner through an atomic layer deposition (ALD) process. The liner layer 311 conformally covers the fins 300 and interior surface of the isolation trenches 120. For example, the liner layer 311 may be a silicon oxide layer and may have a thickness of about 50~70 angstroms, but is not limited thereto.

The stress-buffer film 312 is deposited directly on the liner layer 311. Therefore, the stress-buffer film 312 is in direct contact with the liner layer 311. The stress-buffer film 312 completely fills a lower portion 120b that is located at least below half of a trench depth d of the isolation trenches 120. For example, the stress-buffer film 312 may be an amorphous silicon layer and may have a thickness of about 40~80 angstroms, but is not limited thereto. For example, the stress-buffer film 312 may have a thickness that is greater than or equal to about 40 angstroms at a fin pitch P of about 48 nm. For example, the stress-buffer film 312 may have a thickness ranging between about 40 angstroms and about 80 angstroms at a fin pitch P of about 48 nm.

The trench-fill oxide layer 313 is deposited directly on the stress-buffer film 312. Therefore, the trench-fill oxide layer 313 is in direct contact with the stress-buffer film 312. The trench-fill oxide layer 313 completely fills an upper portion 120a of each of the isolation trenches 120. According to one embodiment, the trench-fill oxide layer 313 is a silicon oxide layer deposited by performing a flowable chemical vapor deposition (FCVD) process.

Figure 3:
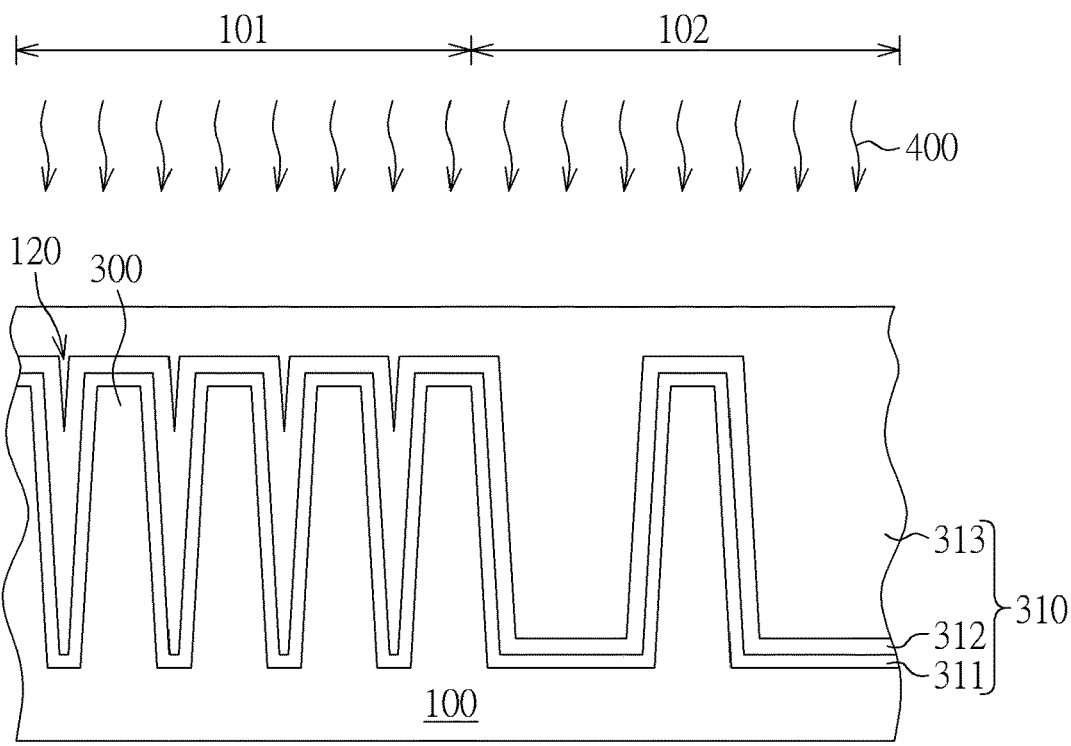

Subsequently, as shown in FIG. 3, an annealing process 400 is performed to anneal the trench-fill oxide layer 313. For example, the annealing process 400 may be performed at a temperature of about 1000° C., but is not limited thereto. According to one embodiment, the stress-buffer film 312 may be converted to silicon suboxide film of formula SiOy, wherein y<2. According to one embodiment, the trench-fill oxide layer may be a silicon oxide film of formula SiOx, wherein x<y.

Figure 4:
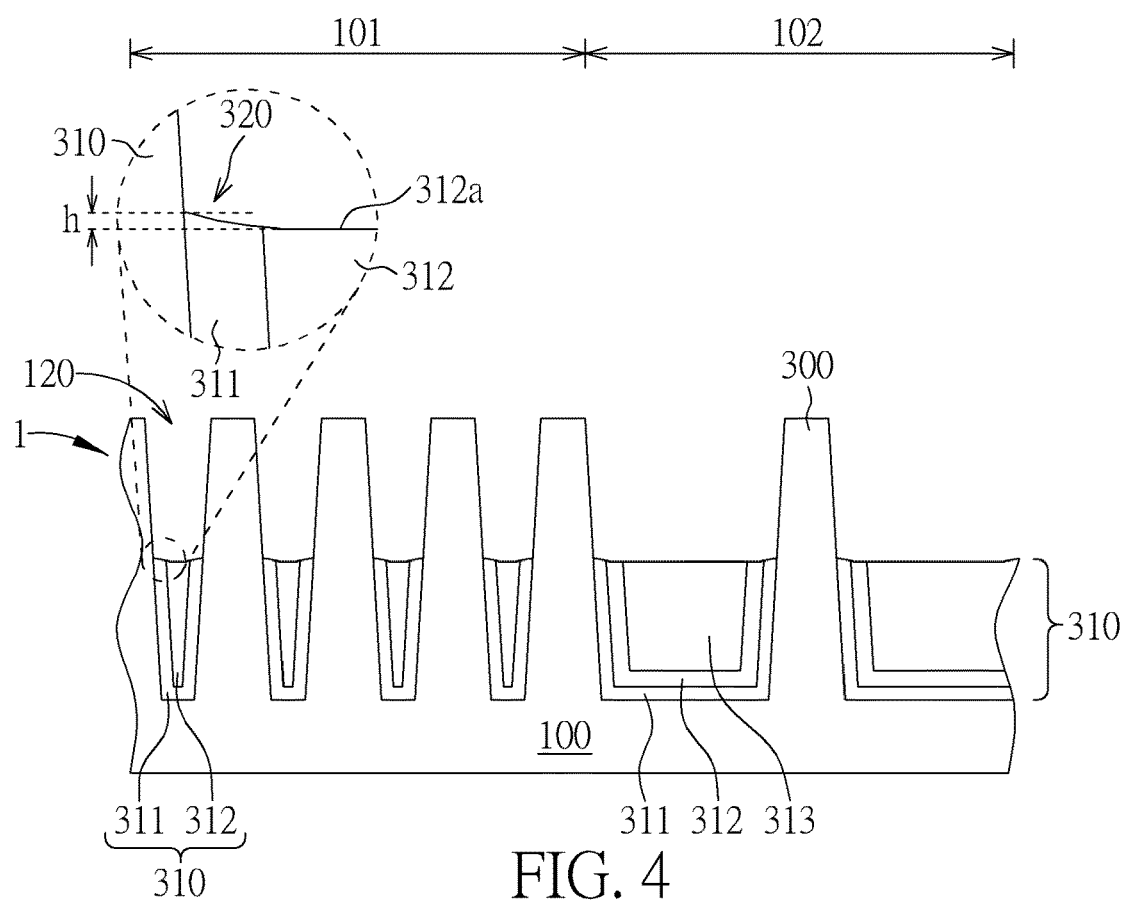

As shown in FIG. 4, a planarization process (not shown in the drawings) may be performed to polish the trench-fill oxide layer 313, the stress-buffer film 312, and the liner layer 311 until the top surfaces of the fins 300 are exposed. Subsequently, the remaining trench-fill oxide layer 313, the stress-buffer film 312, and the liner layer 311 are recess etched, thereby exposing the upper portion of the each of the fins 300. The above-mentioned fin-recess process is known in the art. For example, the trench-fill oxide layer 313, the stress-buffer film 312, and the liner layer 311 may be etched by using SiCoNi dry etching process. In one embodiment of the present invention, the SiCoNi dry etching process primarily includes the step of reacting the fluorine-containing gas with the silicon oxide to synthesize diammonium fluosilicate (($NH_4$)$_2$$SiF_6$). In this way, the silicon oxide can be selectively removed. The aforesaid fluorine-containing gas may comprise hydrogen fluoride (HF) or nitrogen trifluoride ($NF_3$).

In FIG. 4, a wicking structure 320 with a height h may be defined between a peak adjacent to the sidewall surface of the fin 300 and a lowest point of the top surface 312a of the stress-buffer film 312 in the dense region 101. The wicking structure 320 is formed between the fins 300 with a small pitch and covers the sidewalls of the fins 300 as shown in FIG. 4. The wicking structure 320 on the fins 300 affects the effective height of the fins 300 and adversely affects the performance of the semiconductor device. Therefore, it is desired to reduce the height h of the wicking structure 320 as much as possible. The present disclosure addresses this issue by providing a stress-buffer film 312 in the isolation layer 310.

It is noteworthy that in the dense region 101, only the stress-buffer film 312 and the liner layer 311 are left in the isolation trenches 120. Therefore, the stress-buffer film 312 and the liner layer 311 constitute the isolation structure in each of the isolation trenches 120 in the dense region 101, while in the isolated region 102 the trench-fill oxide layer 313, the stress-buffer film 312 and the liner layer 311 constitute the isolation structure in each of the isolation trenches 120. By providing such configuration, the height h of the wicking structure 320 may be reduced to about 1.74 nm in a case that the stress-buffer film 312 has a thickness of about 40 angstroms at a fin pitch P of about 48 nm.

Structurally, as shown in FIG. 4, a semiconductor device 1 comprises a substrate 100 having at least two fins 300 thereon and an isolation trench 120 between the at least two fins 300. An isolation structure 310 is disposed in the isolation trench 120. The isolation structure 310 consists of a liner layer 311 covering a lower sidewall of each of the at least two fins 300 and a bottom surface of the isolation trench 120, and a stress-buffer film 312 on the liner layer 311. The stress-buffer film 312 is a silicon suboxide film of formula SiOy, wherein y<2.

It is advantageous to use the present disclosure because the height h of the wicking structure can be reduced by introducing the stress-buffer film 312 on the liner layer 311 in the isolation trenches 120.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate having at least two fins thereon and a first isolation trench between the at least two fins within a first region, and a second isolation trench in the substrate within a second region;
   depositing a liner layer on the substrate, wherein the liner layer conformally covers the two fins and interior surface of the first isolation trench within the first region, and conformally covers the second isolation trench within the second region;
   depositing a stress-buffer film on the liner layer, wherein the liner layer and the stress-buffer film completely fills a lower portion that is located at least below half of a trench depth of the first isolation trench within the first region, wherein the stress-buffer film conformally covers the liner layer in the second isolation trench with the second region; and
   depositing a trench-fill oxide layer to fill into an upper portion of the first isolation trench, wherein the lower portion of the first isolation trench does not include the trench-fill oxide layer.

2. The method of claim 1, wherein the liner layer is a silicon oxide layer deposited by performing an atomic layer deposition (ALD) process.

3. The method of claim 1, wherein the stress-buffer film comprises amorphous silicon.

4. The method of claim 1, wherein the stress-buffer film has a thickness that is greater than or equal to about 40 angstroms at a fin pitch of about 48 nm.

5. The method of claim 1, wherein the stress-buffer film has a thickness ranging between about 40 angstroms and about 80 angstroms at a fin pitch of about 48 nm.

6. The method of claim 1, wherein the trench-fill oxide layer is a silicon oxide layer deposited by performing a flowable chemical vapor deposition (FCVD) process.

7. The method of claim 1 further comprising:
   subjecting the trench-fill oxide layer to an anneal process.

8. The method of claim 7, wherein during the anneal process, the stress-buffer film is converted to silicon suboxide film of formula $SiO_y$, wherein $y<2$.

9. The method of claim 7 further comprising:
   polishing the trench-fill oxide layer, the stress-buffer film, and the liner layer until a top surface of the at least two fins is exposed; and
   recess etching the trench-fill oxide layer, the stress-buffer film, and the liner layer, thereby exposing an upper portion of the each of the at least two fins.

* * * * *